United States Patent [19]

Martinez

[11] 4,117,405
[45] Sep. 26, 1978

[54] NARROW-BAND RADIO COMMUNICATION SYSTEM

[76] Inventor: Louis Martinez, 12011 Bion Dr., Fort Washington, Md. 20022

[21] Appl. No.: 737,902

[22] Filed: Nov. 2, 1976

[51] Int. Cl.$^2$ .......................... H04B 1/00; H04B 7/00
[52] U.S. Cl. ........................................ 325/58; 325/3; 325/31; 325/419; 331/1 A; 331/2
[58] Field of Search .................. 325/31, 51, 53–55, 325/58, 64, 346, 349, 419–421, 423, 9, 1, 3, 4, 5, 10, 11; 340/147 SY, 183, 408, 413, 224; 174/15 BP, 15 AL; 343/6.5 SS, 176, 179, 200; 331/1 A, 17, 25, 2

[56] References Cited

U.S. PATENT DOCUMENTS

| | | | |
|---|---|---|---|
| 2,710,343 | 6/1955 | Thompson | 325/3 |
| 3,370,235 | 2/1968 | Miyagi | 325/9 |
| 3,418,579 | 12/1968 | Hultberg | 325/58 |
| 3,546,617 | 12/1970 | Westwood | 331/2 |
| 3,646,444 | 2/1972 | Bitzer | 325/58 |
| 3,769,602 | 10/1973 | Griswold | 331/25 |
| 3,862,365 | 1/1975 | Kobayashi et al. | 325/58 |
| 3,980,954 | 9/1976 | Whyte | 325/64 |

Primary Examiner—Robert L. Griffin
Assistant Examiner—Jin F. Ng

[57] ABSTRACT

Ultra-narrow-band system for communication between a transmitter device and a receiver device provided by locking both to a carrier signal from a radio broadcast station and synthesizing a precise local frequency at each device as a preset multiple of the frequency of the carrier. Such a system is usable in a multi-station alarm and status communication system including a multiplicity of independent radio alarm transmitters whose various carrier frequencies are different from but phased locked to a local radio broadcast station, and a central alarm receiving station which employs a corresponding multiplicity of synchronous detectors. The detectors each have associated with them a synthesized local oscillator source which is also phase-locked to the same radio broadcast station used by the alarm transmitters. Both the alarm transmitters and the central receiver are thereby accurately referenced to a readily available local frequency source (the broadcast station). As a consequence, very narrow-band radio circuits may be employed and the receiver and transmitter bandwidth may be accurately matched to the information content of the alarm and status signal source to achieve high signal-to-noise ratio reliable transmissions. The disclosed apparatus is relatively immune to intentional or unintentional interference and will burn-through most conventional transmissions which may be transmitting on the same radio channel at the same time, without unduly bothering those other unrelated transmissions.

9 Claims, 5 Drawing Figures

NARROW-BAND RADIO COMMUNICATION SYSTEM

BACKGROUND OF THE INVENTION

1. Field of the Invention

This invention relates to narrow-band, relatively ultra-stable radio apparatus for communicating signals from protected premises or other locations from which messages must be transmitted to a central monitoring point, such as a police station or maintenance center.

2. Description of Prior Art

The transmission of priority signals such as burglary, fire, emergency medical, and other signals represents an important segment of the communication art wherein high reliability and immediacy of transmission are important. The alarm industry has customarily employed telephone lines for this purpose and in particular has used a so-called DC circuit wherein a continuous direct current path is established between a sender and a receiver to provide a channel of communication and to detect the presence of tampering or interference, for example the cutting of a telephone line. Such DC telephone paths are becoming obsolete and are being replaced by more expensive multiplexed telephone circuits employing subcarriers. A strong need has arisen for alternative means of alarm communication.

Radio alarm communication using conventional techniques has not been very reliable because of the relatively poor signal-to-noise ratio that results from interference from both natural and man-made signals and because of interference from legitimate signals sharing the channel which may be using the channel when an alarm condition occurs. The scarcity of radio-frequency channels further aggravates this condition.

Radio alarm transmitters in the prior art generally incorporate both a receiver and a transmitter so that they may monitor for the presence of radio transmission on their channel prior to transmitting an alarm signal in order to avoid interference or masking of signals which could negate both the alarm transmission and the intelligibility of the interfering signal.

Prior-art devices have not been able to economically employ narrow-band transmission techniques because the available frequency determining sources, for example crystal oscillators, have not been sufficiently stable to permit very narrow-band transmissions that are commensurate with the bandwidth of the alarm and status signal information content (e.g. under 100 Hz bandwidth) and acceptable transmission time. Prior-art devices are also relatively complicated when designed to use synchronous detection techniques in the receiving circuits since no local frequency reference for the synchronous process is available and it must be generated from the usually weak incoming alarm signal.

Swanson (U.S. Pat. No. 3,883,874) has disclosed an apparatus which provides a source of standard frequency for radio communication and navigation. This apparatus is phase locked to commuted signals at the same frequency using a multiplexed antenna. Swanson employs very-low frequency (VLF) radio signal sources, specifically highly stable OMEGA navigation signals, or possible other highly stable VLF transmissions such as standard radio transmission from the National Bureau of Standard WWV stations, in order to generate absolute standard frequencies. The detection and use of such standard frequency transmissions is unnecessarily complicated because special radio receiver circuits are needed to detect VLF signals and because of the attempt to generate absolute standard frequency.

SUMMARY OF THE INVENTION

The disclosed apparatus employs a local radio broadcast station as a relative frequency reference to precisely establish the frequency of independent alarm transmitters and to precisely establish the frequency of a multiplicity of local oscillators in the alarm receiver so as to permit synchronous detection of the alarm signals. Each independent alarm transmitter receives signals from the local broadcast station and incorporates a frequency synthesizer which is phase locked to this broadcast station signal to synthesize the carrier frequency of the alarm transmitter. The frequency of the synthesized signals varies in proportion to the variations in frequency of the carrier of the local broadcast station, but the synthesized signals at the transmitter and receiver are locked to the same carrier and thus allow very narrow selection of received frequencies to eliminate noise. Transmitted and received signals are ultra-stable relative to each other.

The alarm transmitter frequency may be selected from a multiplicity of closely spaced alarm channels, which channels may be only about 100 Hz wide. Therefore upwards of 100 or more separate alarm transmitters may operate on one conventional radio voice channel of 10 KHz bandwidth. Several alarm transmitters may also operate on the same alarm channel by providing suitable time synchronization, using, for example, a polling method hereinafter described.

The central alarm receiver also employs the same radio broadcast station used by the alarm transmitters to phase lock a multiplicity of frequency synthesizers which are used as local oscillators. The central receiver synchronously detects the alarm transmissions in one of a multiplicity of independent parallel channels, which channels correspond to the multiplicity of frequencies used by the independent alarm transmitters. The alarm signals detected by the central receiver are subsequently sent to a response agent, such as a police station. On-off alarm signals may be communicated using this apparatus or status signals comprising a digital coded message may be transmitted.

The alarm transmitters need not monitor their radio channel prior to signal transmission because their narrow transmission bandwidth results in a sufficiently intense concentration of energy in a very small spectrum space so that they can burn through or override most other signal transmissions that may also occupy the same channel. The alarm transmission will not unduly interfere with other signal sources which they override. Though a brief background chirp may be heard in the audio channels of these other transmissions, this will not usually interfere with their intelligibility. The alarm signal may also be transmitted in the so-called "guard band" of frequencies between assigned channels of, for example, voice transmitters.

Any of a number of different broadcast stations, such as commercial AM broadcast stations, television stations, radio navigation stations, and other similar transmitters may be used in the practice of this invention, or a special transmitter may be erected for this purpose. Conventional AM broadcast stations are preferred since they are readily available and are relatively powerful and stable. AM stations that are designated "clear channel" operate 24 hours per day and provide back-up transmitters in the event of failure of the main transmitter, and therefore, are epecially attractive in my invention. Such clear channel AM stations provide strong signals in most metropolitan areas and are readily adapted as reference signals in the practice of the invention.

AM stations will sometime over-modulate and in such instances the carrier of the station is cut-off for time durations as long as 50 milliseconds or longer, and this can sometime interfere with the stability of the frequency synthesizers employed in the alarm transmitters and receivers using my invention. A technique is disclosed herein which uses both a voltage-controlled crystal oscillator and a simpler RC oscillator in a combination which provides a frequency inertia capability which readily smooths out these AM broadcast station carrier drop-outs. The latter combination of two oscillators employs two frequency dividiers and associated phase detectors in a phase locked loop arrangement which permit the selection of any one of a number of local broadcast station frequencies for reference, and the selection of any one of a multiplicity of alarm carrier channels, at the choice of the user.

A method is disclosed for modulating the local radio broadcast station using techniques which do not interfere with the normal signal transmission of said broadcast station in order to provide means to individually poll each of the many independent alarm transmitters so that they may report their status to the central alarm receiving station in sequential or random order.

The invention provides a very-narrow-band radio communication apparatus to achieve high signal-to-noise ratio transmissions. The alarm transmission apparatus can burn through most natural and man-made interfering signals. The radio alarm transmission apparatus need not monitor its radio channel prior to transmission and does not unreasonably interfere with other users of the same local radio channel, even if they transmit simultaneously. Independent alarm transmitters and a central receiving station are tightly and precisely synchronized both at the radio carrier frequency and at digital data clock frequencies associated with the digital status messages.

The invention provides a high capacity alarm transmission system wherein 100 or more alarm transmitter channels can be compressed within one conventional radio voice channel, thereby substantially conserving the radio spectrum. Means are provided for polling and initiating status reporting transmission of independent alarm transmitters using a local radio broadcast station modified to transmit polling signals, which polling signals do not interfere with the normal signal transmissions of said broadcast station. Such an alarm communication apparatus is relatively immune to jamming and intentional interference by intruders.

DESCRIPTION OF THE PREFERRED EMBODIMENT

For purposes of discussion, the following description is directed to the operation of a single transmitter and a receiver combination.

Figure 1:
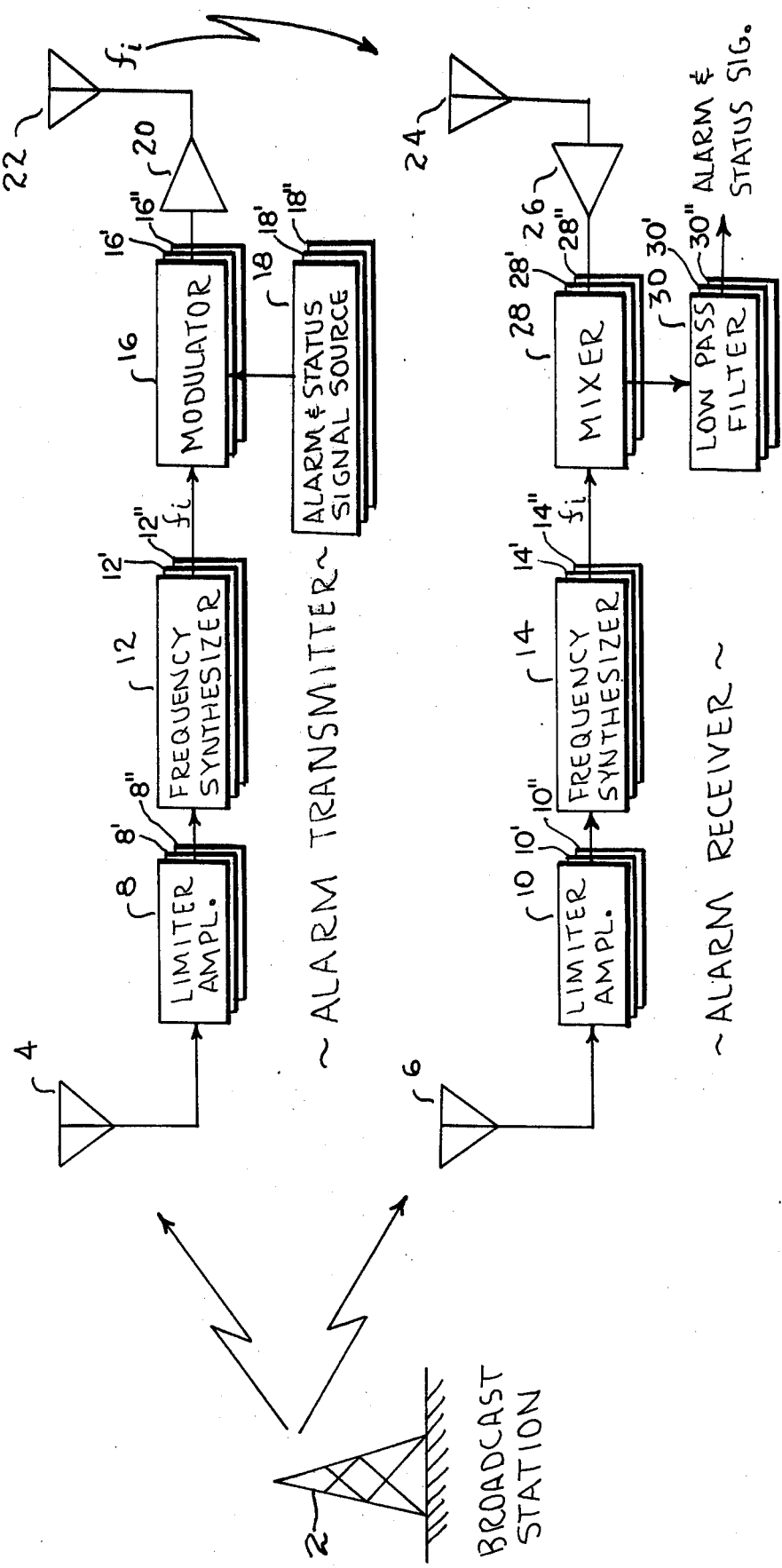
FIG. 1 is a simplified overall block diagram of plural alarm transmitter and plural alarm receiver channels and a local broadcast station.

FIG. 1 graphically portrays broadcast station 2 which may be, for example, a conventional commercial AM broadcast station operating on a clear channel. Receiving antennas 4 and 6 detect the signal from broadcast station 2. This signal is amplified and limited by tuned amplifiers 8 and 10 so as to remove most of the amplitude modulation on the broadcast station signal. Limiter-amplifiers 8 and 10 are designed to provide symmetrical amplitude limiting in both the positive and negative excursions of the broadcast signal and to provide a symmetrical bandpass characteristic so as to minimize undesirable amplitude modulation (AM) to phase modulation (PM) translation which can occur in unsymmetrical channels. This AM to PM translation appears as phase jitter in the output of limiter-amplifiers 8 and 10 and can cause instability in frequency synthesizers 12 and 14. Frequency synthesizers 12 and 14 phase lock to the output signals from limiter-amplifiers 8 and 10 and synthesize a frequency $f_i$, which is usually higher than the frequency of the broadcast station. In the transmitter, a modulator 16 accepts the output $f_i$ of frequency synthesizer 12 and the output of alarm and status signal source 18 and modulates $f_i$ with the signal from source 18. This modulated carrier is amplified by an amplifier 20 and the resulting signal is radiated by an antenna 22.

The front end of the receiver at the central receiving station, including elements 6, 10 and 14, is almost identical to the front end of the alarm transmitter. Antenna 6 receives signals from broadcast station 2 and these signals are amplified and limited by amplifer 10 and fed to frequency synthesizer 14 which synthesizes a frequency $f_i$ identical to the carrier frequency radiated by antenna 22. Antenna 24 detects this transmitted frequency radiated from antenna 22 and it is amplified in amplifer 26 to a level necessary to drive synchronous detector 28. This receiver operates in a manner analogous to so-called zero-IF receivers wherein the local oscillator signal from frequency synthesizer 14 is at the same frequency as the incoming signal detected by antenna 24 so that the mixture of these two signals results in a zero intermediate frequency, except for the thus detected alarm signal which continues through low-pass filter 30. The output of low-pass filter 30 is essentially identical to the transmitted alarm signal generated in source 18.

Figure 2:
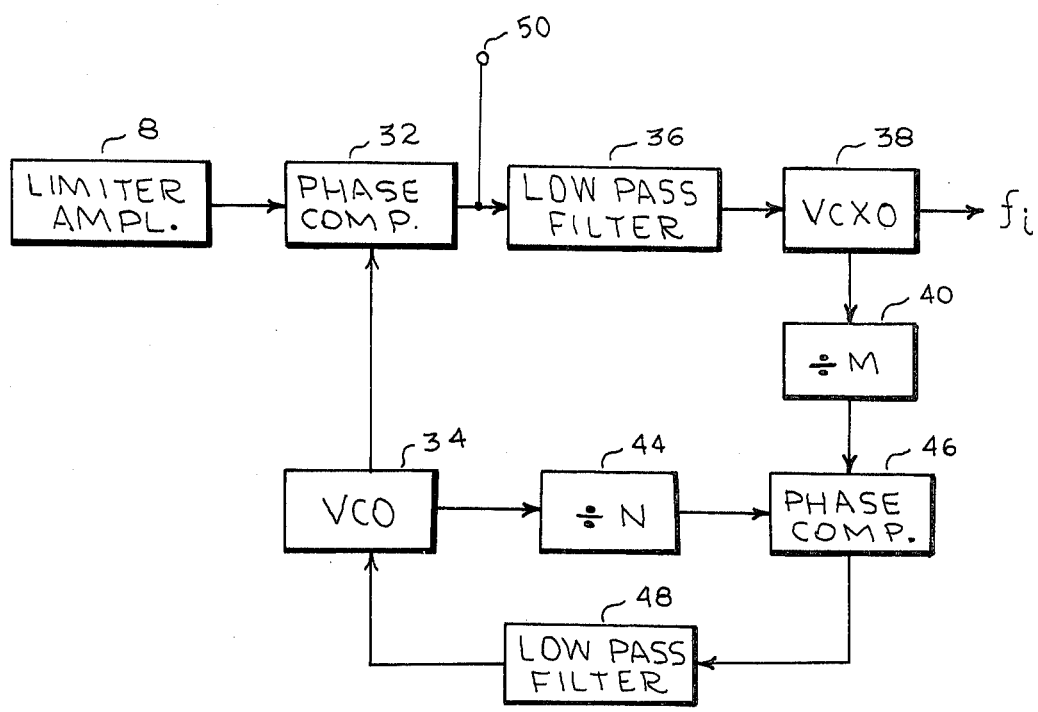
FIG. 2 is a simplified diagram of a frequency synthesizer that phase locks to the broadcast station signal and synthesizes the alarm radio carrier frequency.

A frequency synthesizer which may be used in the alarm transmitters or receivers is illustrated in FIG. 2 which provides a "flywheel" or inertial smoothing action using two separate voltage-controlled oscillators. Conventional AM broadcast stations often over-modulate their radio carriers and this results in an interrupted signal that may result in the loss of a reference carrier for up to 50 milliseconds or perhaps longer. Frequency synthesizers which are phase-locked to such signals may suffer from these carrier interruptions, since they cause significant frequency-synthesizer excursions which are undesirable.

The frequency synthesizer illustrated in FIG. 2 overcomes these problems by providing an inertial smoothing action which will now be described. The signal from limiter-amplifier 8 in FIG. 2 is connected to one input of a phase comparator 32. A second input to phase comparator 32 is taken from the output of a voltage controlled oscillator (VCO) 34. The output of phase comparator 32 is a voltage which is proportional to the difference in phase between the signal from limiter-amplifier 8 and VCO 34. This difference signal from phase comparator 32 is smoothed by a low-pass filter 36 and applied to control the frequency of a voltage controlled crystal oscillator (VCXO) 38. The frequency of VCXO 38 is chosen to be equal to the desired alarm transmitter radio carrier frequency, or a submultiple of it. The frequency from VCXO 38 is divided by frequency divider 40, which divides by the integer M. The output of VCO 34 is divided by the integer N using a divider 44. The output of divider 44 and output of divider 40 are both sent to a phase comparator 46, which provides an output voltage proportional to the difference in phase between the signals from divider 40 and divider 44. The output of phase detector 46 is smoothed in a low-pass filter 48 and applied to control the frequency of VCO 34. The result of this combined action is that VCO 34 is effectively phase locked to VCXO 38, and any variations in VCXO 38 will be followed by corresponding frequency variations in VCO 34. On the other hand, any variation in VCO 34, when compared to the output of limiter-amplifier 8 in phase detector 32, serve to correct the frequency of VCXO 38, which then corrects the frequency of VCO 34 in such a manner so as to minimize the output from phase detector 32. If a signal from limiter-amplifier 8 is momentarily lost due, for example, to over-modulation of the broadcast station carrier, then VCXO 38 will coast and maintain its frequency until the output of limiter-amplifier 8 again appears, at which time the output of VCO 34 will be only slightly out of phase with the output of limiter-amplifier 8. This slight phase error will be immediately detected and will serve to correct the VCXO 38 frequency, consequently bringing VCO 34 into phase with the output of amplifier 8.

Terminals 50 provide an instantaneous indication of the phase difference between limiter-amplifier 8 and VCO 34, and these terminals are used in an identification code comparator and to detect special broadcast signals which will be described in a later section of this specification. The detection is made possible by the smoothing action of VCXO 38.

The frequency synthesizer arrangement in FIG. 2 serves another important function in that the frequency divider ratios N and M of frequency dividers 44 and 40 provide a means of selecting the desired broadcast station frequency and also the desired alarm transmitter frequency $f_i$, respectively. This operation may best be described by a specific example. If we assume that broadcast station 2 is transmitting at an assigned frequency of 640 KHz, and that each alarm transmitter carrier frequency is separated from other alarm transmitter carrier frequencies by an interval of 100 Hz, than the following divider integers N and M are obtained. The integer N is selected to be 6400 so that the output of frequency divider 44 is 100 Hz when VCO 34 oscillates at 640 KHz. This will match the output of limiter-amplifier 8 if the system is properly locked. If we assume that we desire an alarm carrier frequency of 27.065000 MHz, then divider 40 should be set to divide by the integer M = 270,650 so that the output of divider 40 will also be 100 Hz. Under these circumstances VCXO 38 will oscillate at a frequency of 27,065,000 Hz and VCO 34 will oscillate at a frequency of 640,000 Hz when the incoming broadcast station frequency is also 640,000 Hz and the frequency synthesizer is properly phase locked. As a further example, assume that frequency divider 40 is now set to divide by the ratio M = 270,651, the frequency of VCXO 38 would now appear 100 Hz higher in frequency than the example previously described. That is, the frequency of the alarm transmitter would now appear as 27,065,100 Hz.

It should be pointed out that VCXO 38, being a crystal controlled oscillator, is expected to maintain a short term stability on the order of one part in $10^{-8}$, which is readily achieved in reasonably priced crystal oscillators. This means that if VCXO 38 is operating at a frequency of 27.065 MHz, then even if the output of limiter-amplifier 8 suddenly disappears for one second, VCXO 38 would drift in frequency by no more than 0.27 Hz, or approximately 90° in phase from its desired phase. As another, more realistic example, if the broadcast station carrier disappears for 100 milliseconds, then VCXO 38 would not slip out of phase from its desired relationship to the broadcast station by an amount greater than about 10 electrical degrees at 27 MHz. Such a phase error is easily corrected by the disclosed circuit when the broadcast station carrier reappears.

If on the other hand a voltage controlled oscillator of much lower stability than a crystal oscillator were used in place of VCXO 38, the amount of drift occuring during broadcast station carrier drop-outs could be substantially greater than 360° and this could result in the loss of several RF carrier cycles. This would appear as undesirable frequency and phase perturbations on the alarm carrier frequency and might result in unlocking of the alarm transmitter-receiver link.

Thus the frequency synthesizer in FIG. 2 not only provides an inertial smoothing action but also provides a means of preselecting the broadcast station carrier frequency and the alarm carrier frequency. Frequency-divider chains fabricated from large-scale integrated circuits can be readily designed with the necessary number of divider stages and selectable frequency-division ratios Also, the tuning range of VCXO 38 can be readily designed to cover several thousand Hertz so that one crystal can be made to operate over many alarm carrier frequencies, if these frequencies are spaced at intervals on the order of 100 Hz.

Figure 3:
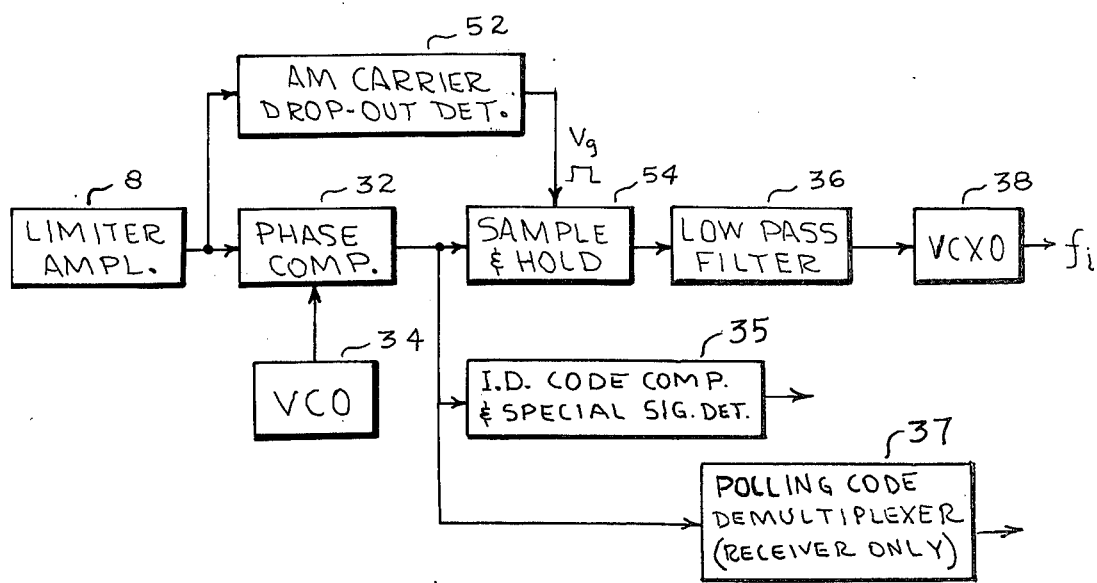
FIG. 3 is a block diagram of a circuit for detecting broadcast station carrier drop-outs and holding the synthesized frequency at the last value which was locked to the carrier.

FIG. 3 illustrates a circuit in which a carrier drop-out detector 52 detects any AM station carrier drop outs and develops a gate voltage $V_g$ which causes a sample-and-hold circuit 54 to freeze the output of phase comparator 34 at the voltage immediately preceeding a carrier drop-out and thereby further to minimize undesirable excursions of oscillator 38 during these carrier drop-outs. When the AM carrier reappears, gate voltage $V_g$ is removed and the output of comparator 32 is effectively reconnected to filter 36.

Identification code comparator and special signal detector 35 detects special information and code transmisions from the broadcast station to control actions at the transmitter site such as status signal transmissions and power-up sequences. Polling code demultiplexers 37 may be used at the central receiver stations to generate time gating signals to sort out and identify multiplexed alarm signals and thereby further to increase the number of alarm transmitters sharing one conventional radio channel.

Figure 4:
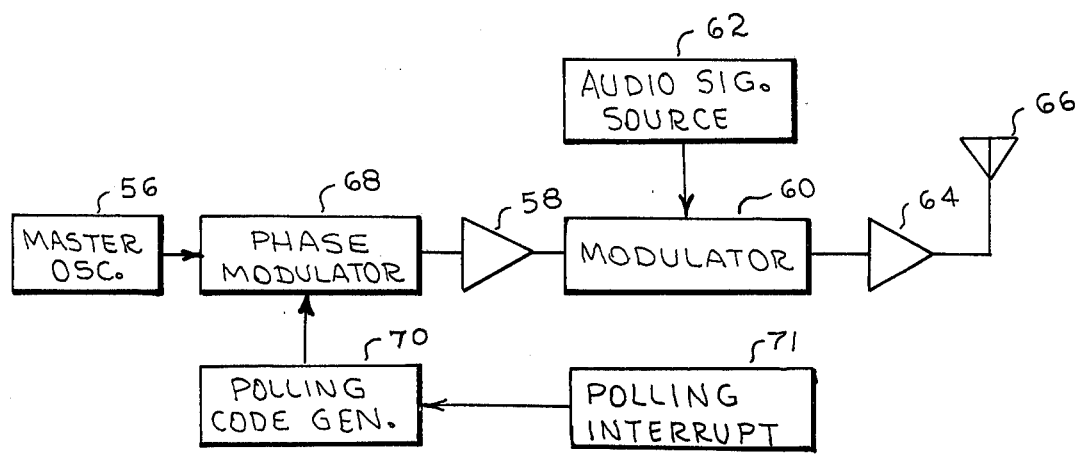
FIG. 4 is a block diagram illustrating the modifications necessary to a conventional AM broadcast station so that it may generate polling signals.

FIG. 4 shows a modification to a conventional AM broadcast station so that this station will be capable of transmitting digitally coded polling code signals without interfering with the transmission of conventional audio program material. A conventional AM broadcast station usually incorporates a master oscillator 56 which establishes the radio carrier frequency of the broadcast station, and a buffer amplifier 58 following the master oscillator. This is followed by an amplitude modulator 60 which receives input signals from audio signal source 62 and provides at its output a modulated carrier to power amplifier 64, which subsequently radiates this modulated carrier through an antenna 66. Polling interrupt circuit 71 provides a means for interrupting the normal polling sequence to query a specific alarm transmitter.

In one variation of the invention this arrangement is modified by inserting a phase modulator 68 between the master oscillator 56 and the buffer amplifier 58, and a polling code generator 70 is included. Polling code generator 70 incorporates a stored sequence of digital-code signals which correspond to the identification code assigned to the multiplicity of alarm transmitters which will be phase locked to the broadcast station. These coded identification signals may be generated by the polling-code generator in a sequential order or in any arbitrary order. For example, polling code generator 70 can generate a specific identification code to interrogate a specific alarm transmitter at any time, thereby interrupting the normal sequence.

Polling code generator 70 phase modulates the output of master oscillator 56 in phase modulator 68. The amount of phase modulation, that is the phase-deviation ratio, is set so that the carrier frequency of the AM broadcast station will not effectively deviate beyond the legally assigned frequency tolerance limits. For AM broadcast stations in the United States, this tolerance in carrier frequency set-on accuracy is established by the Federal Communications Commission and is ±20 Hz at the present time. In other words, the result of phase modulation caused by modulator 68 must not result in significant side bands which have the effect of deviating the median frequency of master oscillator 56 beyond 20 Hz from the normally assigned frequency of the broadcast station. This criteria can be readily established by appropriately selecting the amount of phase deviation and the rate at which this phase is deviated based on well-known modulation theory. For example, one may use an effective polling modulation rate of 18 Hz and deviate the AM carrier by ±15° in phase. This would be readily detectable by a code comparator and would not disturb VCXO oscillator 38 in the alarm transmitters and receivers, or the regular AM audio program material.

Audio signal source 62 comprises the conventional audio-program material and results in AM side bands which normally exist at frequencies greater than 20 Hz away from the nominal radio carrier frequency. On the other hand if the modulation due to phase modulator 68 is kept within 20 Hz of the nominal carrier frequency, then the modulation due to phase modulator 68 will not interfere with modulation due to amplitude modulator 60. Therefore both signals can be transmitted in a compatible mode so that neither signal interferes with the other.

Figure 5:
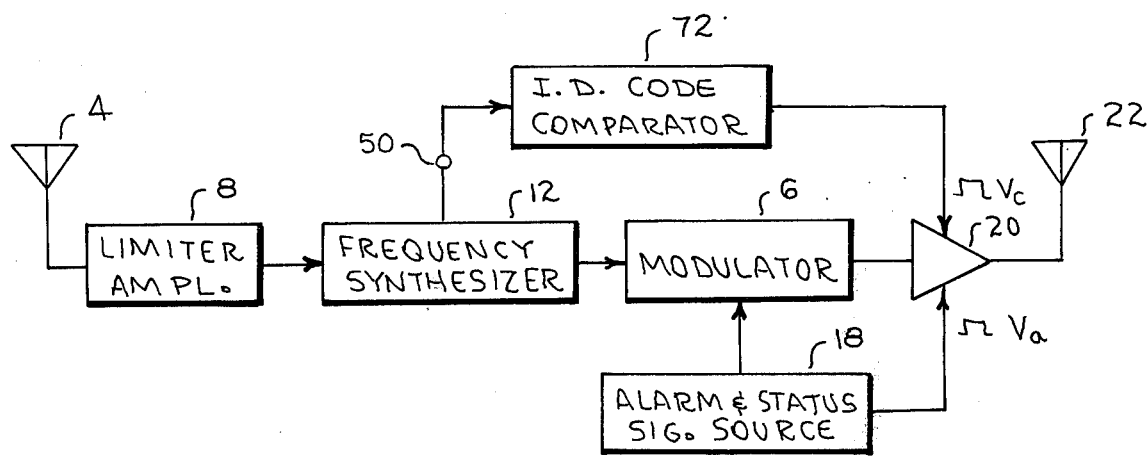
FIG. 5 is a block diagram of the alarm transmitter shown in FIG. 1 but modified to detect polling signals.

FIG. 5 is a block diagram of the alarm transmitter shown in FIG. 1 but modified to include an identification code comparator 72 which is designed to detect the coded polling signals transmitted from the modified AM broadcast station shown in FIG. 4.

The operation of the polled alarm transmitter is as follows. The terminal 50 shown in FIG. 2 and FIG. 5 provides a voltage which represents the instantaneous phase difference between the output of VCO 34 and limiter-amplifier 8. Therefore, if any phase modulation exists on the incoming AM broadcast station, this phase deviation will appear on terminal 50. When the modified AM broadcast station shown in FIG. 4 is modulated with polling-code signals, these signals will appear on terminal 50 of the frequency synthesizer in FIG. 2. Thus, identification code comparator 72 will see these digital-coded polling signals and can compare these with pre-selected code stored within comparator 72. When the incoming identification code matches the code stored in comparator 72, a trigger voltage pulse $V_c$ is sent to gated power amplifier 20 so as to cause a status-signal transmission. Thus, the polled alarm transmitter in FIG. 5 will transmit whenever it is polled by the modified AM broadcast station shown in FIG. 4 or when an alarm-signal condition exists in source 18. In the latter case, source 18 will cause a gate voltage $V_a$ which turns on gated transmitteer 20 and causes an alarm transmission.

Obviously many modifications and variations of the present invention are possible in the light of the above teachings. It is therefore to be understood that within the scope of the appended claims the invention may be practiced otherwise than is specifically described.

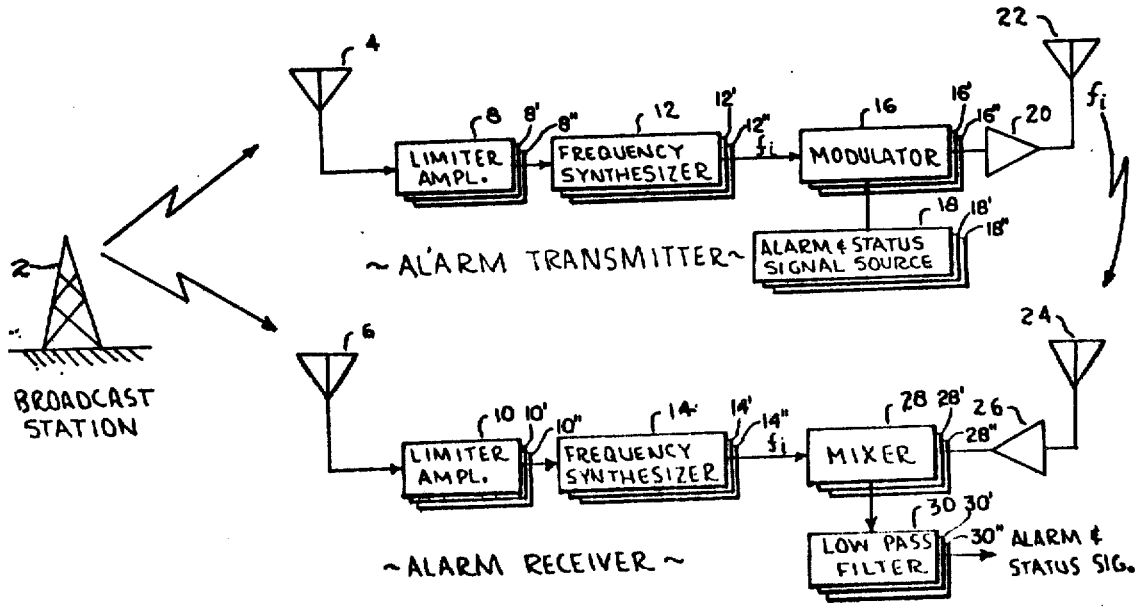

What is claimed is:

1. A frequency-synthesizer responsive to a carrier frequency provided in an amplitude-limited signal from a limiter-amplifier to provide a synthesized signal having a frequency phase-locked thereto, comprising:
   (A) voltage-controlled first oscillator means,
   (B) first phase-comparator means having a first input connected to an output of the amplifier-limiter means and a second input connected to an output of the voltage-controlled first oscillator for providing an output signal proportional to the difference in phase between the signals of the first and second inputs of the phase-comparator means,
   (C) first low-pass filter means for smoothing the signal from the output of said first phase comparator,
   (D) voltage-controlled crystal oscillator means responsive to an output of said first low-pass filter means for providing an output signal with a frequency which is variable as a function of the phase difference between the signals at the first and second inputs of the first phase comparator,
   (E) first frequency-divider means responsive to the output signal of the crystal oscillator to divide the frequency of this output signal from the crystal oscillator by the integer M,
   (F) second frequency-divider means responsive to the output signal of the first oscillator to divide frequency of the output signal from the first oscillator by the integer N,
   (G) second phase-comparator means having a first input responsive to the output of the first frequency divider and a second input responsive to the output of the second frequency divider for providing an output signal proportional to the phase difference between the first and second inputs, and (H) second low-pass filter means responsive to the output of the second phase-comparator means and providing an output connected to an input of the voltage controlled first oscillator means to control the frequency of said first oscillator in a manner which minimizes the phase difference between the first and second inputs to the second phase comparator, whereby the first oscillator frequency is phase-locked to the crystal oscillator frequency and the crystal oscillator is phase-locked to the incoming carrier frequency, the crystal oscillator providing a carrier frequency $f_i$ which can be predetermined by selecting the integer M, while the incoming frequency carrier may be predetermined by selecting the integer N.

2. A frequency-synthesizer in accordance with claim 1 wherein the frequency synthesizer further comprises:
   (A) broadcast-station carrier dropout detector means for detecting over-modulation of the incoming carrier and providing an output gate voltage during said over-modulation, and
   (B) sample-and-hold circuit means responsive to the gate voltage from the drop-out detector and connected between the output of the first phase comparator and the input to the first low-pass filter to freeze the output voltage of the first phase comparator at the voltage existing immediately preceeding said over-modulation of the carrier and thereby to minimize phase-lock errors in the voltage-controlled crystal oscillator during such over-modulation.

3. A narrow-band radio cummunication system for use in connection with a broadcast signal from an existing radio broadcast station operating on a predetermined carrier frequency, comprising:
   (A) a transmitter system comprising:
      (1) first means for receiving the broadcast signal,
      (2) first frequency synthesizer responsive to the received broadcast signal for generating a first synthesized signal at a frequency locked at a predetermined multiple, other than a unity multiple, of the predetermined carrier frequency of the broadcast signal,
      (3) a signal source for providing an information signal,
      (4) means for modulating the information signal on the first synthesized signal to provide a modulated synthesized carrier, and
      (5) means for transmitting the modulated synthesized carrier, and
   (B) a receiver system comprising:
      (1) second means for receiving the broadcast signal,
      (2) second frequency synthesizer responsive to the received broadcast signal for generating a second synthesized signal at a frequency locked at the same predetermined multiple of the predetermined carrier frequency of the broadcast signal,
      (3) means for receiving the modulated synthesized carrier, and
      (4) demodulator means responsive to the second synthesized signal and the modulated synthesized carrier for deriving a detected signal proportional to said information signal.

4. A narrow-band radio communication system comprising, in combination, a plurality of remote radio transmitters each having a corresponding narrow-band message source connected thereto, a central receiving station to detect signals from the narrow-band signal source, and an existing local radio broadcast station to provide a radio frequency carrier reference for the remote radio transmitters and the central receiving station, the remote radio transmitters each comprising:
   (A) first receiving antenna means for detecting the radio frequency carrier of the broadcast station;
   (B) first tuned amplifier-limiter means connected to the output of the receiving antenna means and tuned to the radio frequency carrier of the broadcast station so as to remove any amplitude modulation thereon and produce an amplitude limited signal replica of the broadcast station radio frequency carrier at its output;
   (C) first frequency synthesizer means connected to an output of the amplifier-limiter means and thereby phase-locked to the radiofrequency carrier of the broadcast station to synthesize therefrom a second radio carrier of predetermined frequency $f_i$ at its output, which frequency $f_i$ may be different for each remote radio transmitter and is different from but phase-locked to the radio frequency carrier of the broadcast station;
   (D) modulator means having a first and second input and one output, the first input being connected to the output of the frequency synthesizer means, and the second input being connected to an output of a corresponding narrow-band message source, the modulator means producing at its output a modulated narrow-band radio signal having a modulated carrier frequency $f_i$ modulated by the narrow-band message source upon occurrence of a message;
   (E) power amplifier means having an input connected to the output of the modulator means to amplify the modulated carrier $f_i$;
   (F) transmitting antenna means connected to an output of the power amplifier means to radiate the amplified modulated carrier $f_i$ to the central receiving station; and
   (G) means at the central receiving station for receiving said radio frequency carrier reference from said broadcast station for detecting, amplifying, separating and demodulating each of the plurality of narrow-band carriers $f_i$ to provide at its output separated message replicas identical to the outputs of the corresponding narrow-band message sources.

5. A narrow-band radio communication system in accordance with claim 4 wherein the means at the central receiving station comprises:
   (A) a second receiving antenna means for receiving signals from the broadcast station;
   (B) second tuned amplifier-limiter means connected to the second receiving antenna means and tuned to the radio frequency carrier of the broadcast station so as to remove any amplitude modulation thereon and produce an amplitude-limited signal replica of the broadcast station radio frequency carrier at its output;
   (C) second frequency synthesizer means connected to an output of the second tuned amplifier-limiter means and thereby phase-locked to the radio frequency carrier of broadcast station to synthesize therefrom a synchronous detector reference signal of said predetermined frequency $f_i$, which frequency $f_i$ is different from, but phase-locked to, the radio frequency carrier of said broadcast station;

(D) a third receiving antenna means for receiving signals from said remote radio transmitters transmitting at corresponding frequency $f_i$;

(E) third tuned amplifier means connected to the output of the third antenna means and tuned to frequency $f_i$;

(F) synchronous detector means having a first input connected to an output of the second frequency synthesizer, and a second input connected to an output of the third tuned amplifier means to synchronously demodulate the modulated carrier $f_i$ received from the transmitting remote radio transmitter, and to provide an unsmooth replica of the message from corresponding narrow-band message source at an output of the detector; and (G) low-pass filter means having an input connected to the output of the detector means for providing a smooth replica of the message from the corresponding narrow-band message source at an output of the filter means.

6. A narrow-band radio communication system in accordance with claim 4 wherein said radio broadcast station comprises a conventional amplitude modulated (AM) commercial broadcast station transmitting 24 hours per day on an assigned frequency in the band 550 KHz to 1600 KHz, the broadcast station incorporating a radio-frequency master oscillator to control the radio frequency of said station, which station is modified to include:

(A) phase modulator means having an output and a first and second input, the first input being connected to an output of the master oscillator and the phase modulator output being connected to an input of convential radio broadcast circuitry following said master oscillator, the phase modulator means being adapted to modulate the radio frequency carrier of said broadcast station without exceeding regulated carrier-frequency tolerance limits;

(B) polling-code generator means having an input and an output, the output of the polling-code generator being connected to the second input of the phase modulator, for generating remote radio transmitter identification code signals in sequential or random order; and (C) polling-interrupt means connected to the input of the polling-code generator means to alter the order of the polling sequence and permit immediate polling of any specified remote radio transmitter from among the plurality of said transmitters.

7. A narrow-band radio communication system in accordance with claim 6 wherein the remote radio transmitters further include identification-code comparator means connected in parallel to an output of the first tuned limiter-amplifier means and to an output of the first frequency synthesizer means to compare the outputs therefrom with a predetermined code stored in the identification-code comparator to enable a status signal to be radiated to the central receiving station when the predetermined code is identical to the polling identification code signal transmitted by said broadcast station.

8. A narrow-band radio communication system in accordance with claim 4 wherein the frequency synthesizer further comprises:

(A) broadcast station carrier drop-out detector means for detecting broadcast station over-modulation conditions and providing an output gate voltage during said over-modulated conditions;

(B) sample-and-hold circuit means responsive to the gate voltage from the drop-out detector and connected between the output of the first phase comparator and the input to the first low-pass filter to freeze the output voltage of the first phase comparator at the voltage existing immediately prior to said broadcast station carrier drop-out and to thereby minimize phase-lock errors in the voltage-controlled crystal oscillator during such dropouts; and (C) identification-code comparator means connected to the output of the first phase-comparator means to detect special phase-modulated signals broadcast from the broadcast station and to compare the phase-modulated signals with a predetermined code stored in the identification-code comparator means and to enable a status signal to be radiated to the central receiving station in response to the special phase-modulated signal when the predetermined code is identical to the broadcast identification code signal, and to control other actions at the corresponding remote radio transmitter.

9. A narrow-band radio communication system comprising:

(A) a plurality of independent radio transmitter means adapted to transmit radio signals on a corresponding plurality of closely spaced radio carrier frequencies that are phase-locked to the carrier of a local radio broadcast station, the radio transmitter means being adapted to accept message signals from message sources connected at their respective inputs and to transmit the message signals to a central station receiver selectively in response to coded polling signals transmitted from the local ratio broadcast station;

(B) the central station receiver being adapted to receive the radio signals simultaneously at said plurality of closely spaced radio carrier frequencies, and to detect and demodulate the radio signals using a plurality of synchronous detector means, wherein reference signals fed to the synchronous detector means are derived from a corresponding plurality of frequency synthesizers, the frequency synthesizers being phase-locked to the same local radio broadcast station carrier used by the radio transmitter means;

(C) coded polling means to modulate the carrier of the local radio broadcast station in a manner that does not interfere with normal signal transmission of said local radio broadcast station, and to thereby provide selective polling of the radio transmitter means to enable coordinated frequency and time-division multiplexing of the message signals;

(D) coded polling detector means incorporated in the central station receiver responsive to the coded polling signals transmitted from the local radio broadcast station to provide demultiplexer identification and time-control signals; and (E) demultiplexer means incorporated in the central station receiver responsive to the demultiplexer identification and time-control signals to sort out, identify and provide individual message signals corresponding to the message signals accepted from the respective message signal sources.

* * * * *

UNITED STATES PATENT OFFICE
CERTIFICATE OF CORRECTION

Patent No. 4,117,405　　　　　　　　　Dated September 26, 1978

Inventor(s) Louis Martinez

It is certified that error appears in the above-identified patent and that said Letters Patent are hereby corrected as shown below:

The figure on the cover sheet should be deleted and the figure on the attached sheet substituted therefor.

Signed and Sealed this

Twenty-seventh Day of February 1979

[SEAL]

Attest:

RUTH C. MASON
Attesting Officer

DONALD W. BANNER
Commissioner of Patents and Trademarks

UNITED STATES PATENT OFFICE
CERTIFICATE OF CORRECTION

Patent No. 4,117,405  Dated September 26, 1978

Inventor(s) Louis Martinez

It is certified that error appears in the above-identified patent and that said Letters Patent are hereby corrected as shown below: